US011114577B2

(12) United States Patent
Kubo et al.

(10) Patent No.: US 11,114,577 B2
(45) Date of Patent: Sep. 7, 2021

(54) PHOTOVOLTAIC POWER GENERATION DEVICE

(71) Applicant: Panasonic Intellectual Property Management Co., Ltd., Osaka (JP)

(72) Inventors: Koichi Kubo, Osaka (JP); Tomohide Yoshida, Nara (JP); Mamoru Arimoto, Osaka (JP); Naofumi Hayashi, Osaka (JP); Minoru Higuchi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 61 days.

(21) Appl. No.: 16/361,679

(22) Filed: Mar. 22, 2019

(65) Prior Publication Data

US 2019/0221696 A1 Jul. 18, 2019

Related U.S. Application Data

(63) Continuation of application No. PCT/JP2017/031870, filed on Sep. 5, 2017.

(30) Foreign Application Priority Data

Sep. 30, 2016 (JP) .............................. JP2016-192798

(51) Int. Cl.
*H01L 31/05* (2014.01)
*H02S 30/10* (2014.01)
(Continued)

(52) U.S. Cl.
CPC ............ *H01L 31/05* (2013.01); *H01L 31/048* (2013.01); *H02S 20/23* (2014.12); *H02S 30/10* (2014.12); *Y02B 10/10* (2013.01)

(58) Field of Classification Search
None
See application file for complete search history.

(56) References Cited

U.S. PATENT DOCUMENTS 8,752,338 B2 * 6/2014 Schaefer ................. F24S 25/70
52/60
9,003,729 B2 * 4/2015 West ....................... F24S 25/16
52/173.3
(Continued)

FOREIGN PATENT DOCUMENTS

JP 11-117928 A 4/1999
JP 2001-271422 A 10/2001
(Continued)

OTHER PUBLICATIONS

Second and Supplementary Notice Informing the Application of the Communication of the International Application (Form PCT/IB/308) issued in counterpart International Application No. PCT/JP2017/031870 dated Jan. 31, 2019, with Forms PCT/IB/326, PCT/IB/373 and PCT/ISA/237. (13 pages).

(Continued)

*Primary Examiner* — Joshua K Ihezie
(74) *Attorney, Agent, or Firm* — Westerman, Hattori, Daniels & Adrian, LLP

(57) ABSTRACT

This photovoltaic power generation device is provided with: a mounting bracket which is fixed to a roof and on which a frame, arranged on the ridge-side end of a solar cell module, and a frame, arranged on the eave-side end of a solar cell module, are mounted; and a fixing bracket which is arranged in the space between the frame and the frame, and which is fixed to the mounting bracket and holds said frames from above.

12 Claims, 11 Drawing Sheets

(51) Int. Cl.
   *H01L 31/048*   (2014.01)
   *H02S 20/23*    (2014.01)

(56) References Cited

U.S. PATENT DOCUMENTS

| | | | | |
|---|---|---|---|---|
| 9,097,443 | B2* | 8/2015 | Liu | F24S 25/33 |
| 9,276,519 | B2* | 3/2016 | Kobayashi | F24S 25/61 |
| 9,431,953 | B2* | 8/2016 | Stearns | F16M 13/02 |
| 2006/0225780 | A1* | 10/2006 | Johnson, III | E04D 1/2918 |
| | | | | 136/244 |
| 2012/0073220 | A1* | 3/2012 | Kobayashi | E04D 1/30 |
| | | | | 52/173.3 |
| 2012/0304559 | A1* | 12/2012 | Ishida | H01L 31/046 |
| | | | | 52/173.3 |
| 2014/0299177 | A1* | 10/2014 | Sha | F24S 25/613 |
| | | | | 136/251 |
| 2015/0107168 | A1* | 4/2015 | Kobayashi | F24S 25/70 |
| | | | | 52/173.3 |
| 2015/0129517 | A1* | 5/2015 | Wildes | H02S 20/23 |
| | | | | 211/41.1 |
| 2015/0280639 | A1* | 10/2015 | Atchley | H02S 20/23 |
| | | | | 248/237 |
| 2017/0019059 | A1* | 1/2017 | Higuchi | F24S 25/67 |

FOREIGN PATENT DOCUMENTS

| | | |
|---|---|---|
| JP | 2010-261257 A | 11/2010 |
| JP | 2015-214877 A | 12/2015 |
| JP | 2015-221987 A | 12/2015 |

OTHER PUBLICATIONS

International Search Report dated Oct. 24, 2017, issued in counterpart International Application No. PCT/JP2017/031870 (2 pages).

* cited by examiner

PHOTOVOLTAIC POWER GENERATION DEVICE

CROSS-REFERENCE TO RELATED APPLICATION

The present application is a continuation under 35 U.S.C. § 120 of PCT/JP2017/31870, filed Sep. 5, 2017, which is incorporated herein by reference and which claimed priority to Japanese Patent Application No. 2016-192798 filed Sep. 30, 2016. The present application likewise claims priority under 35 U.S.C. § 119 to Japanese Patent Application No. 2016-192798 filed Sep. 30, 2016, the entire content of which is also incorporated herein by reference.

TECHNICAL FIELD

The present disclosure relates to a photovoltaic power generation device.

BACKGROUND

A photovoltaic power generation device is structured with multiple solar cell modules that are mounted on a roof. For example, Japanese Unexamined Patent Application Publication No. 2015-214877 discloses a photovoltaic power generation device including fixing members with eave-side engagement hooks that engage eave-side solar cell modules, and ridge-side engagement hooks that engage ridge-side solar cell modules. The fixing members are fixed to a roof with screws.

SUMMARY

For photovoltaic power generation devices, it is important to firmly fix solar cell modules to a roof while maintaining easy installation and maintenance. Regarding easy maintenance, it is required that among multiple solar cell modules forming the photovoltaic power generation device, target modules alone can be replaced.

A photovoltaic power generation device according to one aspect of the present disclosure includes a first cell module that includes a first solar cell panel and a first frame installed at edge portions of the first solar cell panel, and a second solar cell module that includes a second solar panel and a second frame installed at edge portions of the second solar cell panel. The second solar cell module is disposed next to and on a ridge-side of the first solar cell module with a space therebetween. The photovoltaic power generation device also includes a mounting bracket that is fixed to a roof. The first frame disposed at a ridge-side edge portion of the first solar cell module and the second frame disposed at an eave-side edge portion of the second solar cell module are disposed on the mounting bracket. The photovoltaic power generation device further includes a fixing bracket that is disposed at the space to straddle between the first frame and the second frame. The fixing bracket is fixed to the mounting bracket to press the frames from above.

According to one aspect of the present disclosure, a photovoltaic power generation device is provided that achieves an easy installation and maintenance, while allowing a fix mounting of solar cell modules to a roof.

BRIEF DESCRIPTION OF DRAWINGS

The figures depict one or more implementations in accordance with the present teachings, by way of example only, not by way of limitations. In the figures, like reference numerals refer to the same or similar elements.

DESCRIPTION OF EMBODIMENTS

Figure 1:
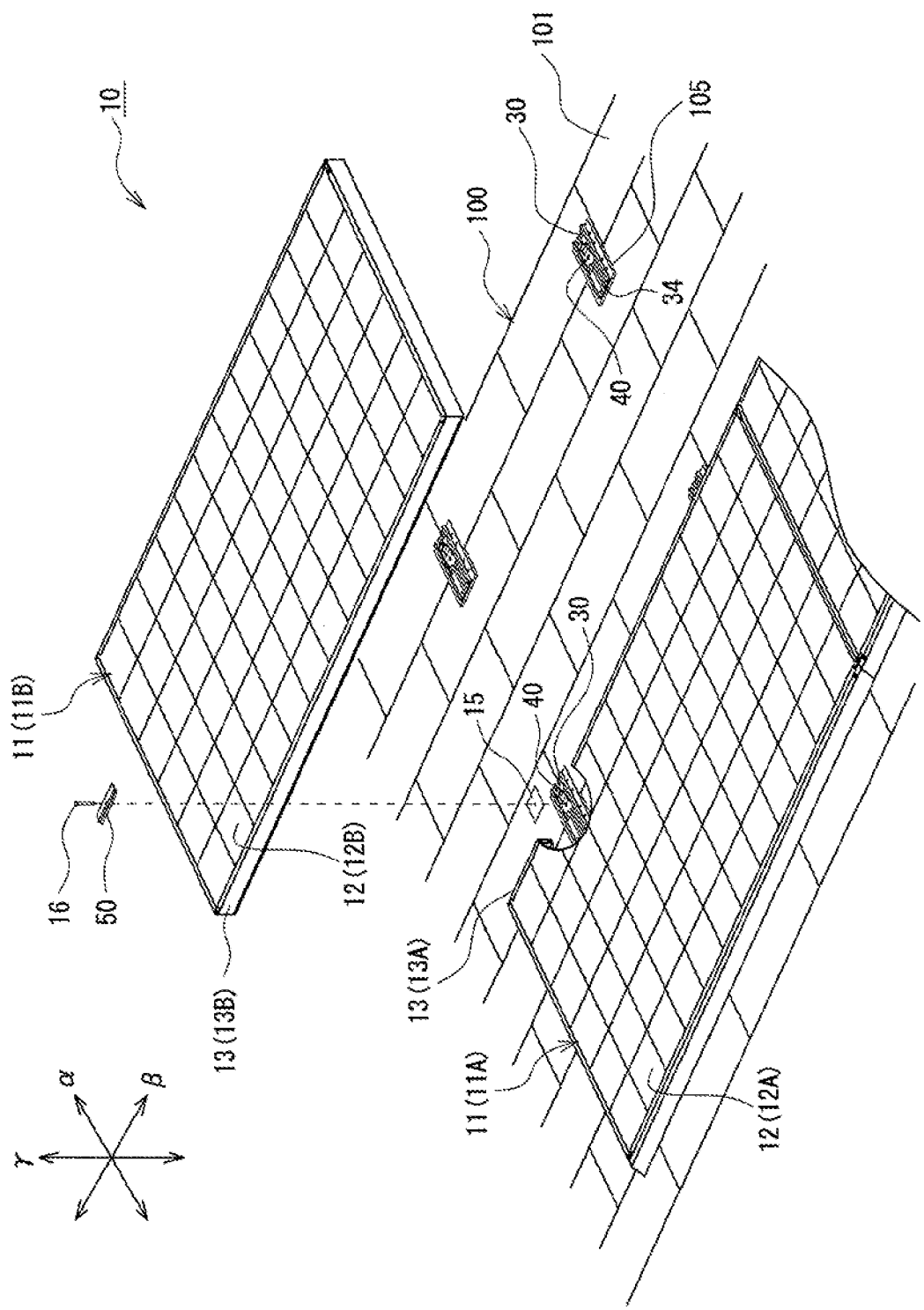
FIG. 1 is an exploded perspective diagram of a photovoltaic power generation device according to one embodiment of the present disclosure.

A photovoltaic power generation device according to one aspect of the present disclosure includes mounting brackets, each of which supports two solar cell modules, and fixing brackets, each of which is disposed in a space between the two solar cell modules. The fixing bracket is fixed to the mounting bracket so that the fixing bracket presses the solar cell modules from above. According to such an arrangement, the photovoltaic power generation device can be installed by a simple method, i.e., by placing the two solar cell modules on the mounting bracket and attaching the fixing bracket to straddle between the two solar cell modules. Further, among multiple solar cell modules forming the photovoltaic power generation device, for example, a single module alone may be easily replaced. Because the solar cell modules can be firmly fixed onto the mounting brackets that are screwed to a roof a highly load bearing photovoltaic power generation device can be achieved.

One embodiment according to the present disclosure is described in detail below with reference to the attached drawings. The drawings that are referred to describe embodiments that are schematically illustrated. Dimensions and other details in the drawings must be determined in consideration of description below. In the present description, taking "substantially the same" as an example, the term "substantially" is intended to indicate not only "completely the same" but also "being able to be considered as substantially the same". Embodiments described below are merely examples. The photovoltaic power generation devices according to the present disclosure are not limited to those embodiments.

In the description below, the direction of the mounting bracket or other elements along the eave-ridge direction is referred to as a "longitudinal direction", while the direction of the mounting bracket or other elements along the girder direction of the roof (perpendicular to the eave-ridge direction) is referred to as a "lateral (right-left) direction". The direction of the mounting bracket or other elements along the direction perpendicular to a roof surface (a surface of roofing material when the mounting bracket is mounted on the roofing material) on which the mounting bracket is mounted is referred to as a "vertical direction". In the drawings, the eave-ridge direction (longitudinal direction) is shown by an arrow α, the girder direction (lateral direction) by an arrow β, and the vertical direction by an arrow γ. Unless otherwise specified, the top of the mounting bracket or other elements refers to the top with respect to the vertical direction.

FIG. 1 is an exploded perspective diagram of a photovoltaic power generation device 10 according to an embodiment of the present disclosure. As shown in FIG. 1, the photovoltaic power generation device 10 includes a solar cell module 11A (first solar cell module), a solar cell module 11B (second solar cell module), mounting brackets 30, and fixing brackets 50. The solar cell module 11A includes a solar cell panel 12A (first solar cell panel) and a frame 13A (first frame) installed at edge portions of the solar cell panel 12A. The solar cell module 11B includes a solar cell panel 12B (second solar cell panel) and a frame 13B (second frame) installed at edge portions of the solar cell panel 12B. The solar cell module 11B is disposed next to and on the ridge-side of the solar cell module 11A with a space S (refer to FIG. 7 described below) therebetween.

The photovoltaic power generation device 10 is structured with the multiple solar cell modules 11 (11A, 11B) installed on a roof 100. For convenience of description, the two solar cell modules 11 that are disposed next to each other along the eave-ridge direction are described in the present description. The module on the eave side is referred to as the solar cell module 11A, and the module on the ridge-side as the solar cell module 11B. In the present embodiment, the solar cell modules 11 are all assumed to have the same shape.

As described in detail below, the mounting bracket 30 is fixed to the roof 100 so that the frame 13A mounted to a ridge-side edge portion of the solar cell module 11A and the frame 13B mounted to an eave-side edge portion of the solar cell module 11B are disposed on the mounting bracket 30. The fixing bracket 50 is disposed in the space S to straddle between the frame 13A and the frame 13B, and fixed to the mounting bracket 30 so that the fixing bracket 50 presses the frames 13A, 13B from above.

In the present embodiment, a grounding bracket 15 is disposed on each of the mounting brackets 30 so that the frames 13A, 13B are disposed on each mounting bracket 30 via the grounding bracket 15. The photovoltaic power generation device 10 may further include a base bracket 40 to which a bolt 16 for fixing the fixing bracket 50 is fastened. The mounting bracket 30 may include a guide rail portion 34 that slidably supports the base bracket 40 so that the base bracket 40 is slidable along the eave-ridge direction. The fixing bracket 50 is fixed to the mounting bracket 30 via the base bracket 40 inserted into the guide rail portion 34.

The photovoltaic power generation device 10 is mounted to the roof 100 on which roofing materials 101 are placed. The roofing materials 101 are, for example, slate tiles. The roofing materials 101 are disposed such that the roofing materials 101 on the ridge-side are overlapped with some portions of the roofing materials 101 on the eave side. Accordingly, steps are formed at the overlapping portions of the roofing materials 101. It should be noted that the roof on which the photovoltaic power generation device 10 is installable is not limited to the roof 100.

The photovoltaic power generation device 10 is configured by fixing the solar cell modules 11 on multiple mounting brackets 30 disposed on the roofing materials 101. The mounting bracket 30 is placed on, for example, the roofing material 101 and a spacer 105 to be screwed to a sheathing roof board 102 (refer to FIG. 7 described below) of the roof 100. The spacer 105 is disposed at the step portion formed between the roofing materials 101 to enable secure attachment of the mounting bracket 30 by filling the step portion. Such a direct installation of the mounting bracket 30 on the roofing material 101 and the spacer 105 can achieve a shorter height of the solar cell modules 11 from the roof surface (surface of the roofing materials 101). In this way, the roof 100 and the photovoltaic power generation device 10 can be more integrally arranged.

As described above, the solar cell modules 11 include the solar cell panels 12 and the frames 13. Each solar cell panel 12 is, for example, a substantially planar panel in which multiple solar cells are sandwiched between two protection members. Each frame 13 is made of, for example, an extruded metal material in which aluminum is the predominant material. The frame encloses the four sides of the solar cell panel 12. Generally, a coating film is applied to surfaces of the frame 13.

Each solar cell module 11 is fixed to the mounting bracket 30 via the base bracket 40, the fixing bracket 50, and the bolt 16 by using the frame 13. In the embodiment shown in FIG. 1, the solar cell modules 11 having a substantial rectangular shape in a plane view are disposed so that the shorter sides are substantially parallel with the eave-ridge direction. The solar cell modules 11 next to each other along the girder direction are arranged to be substantially in contact with each other, whereas the solar cell modules 11 (solar cell modules 11A, 11B) next to each other along the eave-ridge direction are arranged with the space S therebetween.

Each solar cell module 11 may be fixed with four mounting brackets 30 in total, two at the eave-side edge portion and the other two at the ridge-side edge portion. The mounting brackets 30 are arranged on the lower surface of each solar cell module 11, for example on the right and left side of the eave-side edge portion and on the right and left side of the ridge-side edge portion of the module. The frames 13A, 13B of the two solar cell modules 11A and 11B are disposed on the mounting bracket 30 that are disposed in a border area between the solar cell modules 11A, 11B.

The eave-side edge portion and the ridge-side edge portion of the photovoltaic power generation device 10 may be fixed to the roof 100 via the mounting brackets 30, base brackets 40, and the fixing brackets 50, or other specific brackets.

In the embodiment shown in FIG. 1, multiple mounting brackets 30 are disposed along the eave-ridge direction and the girder direction. The mounting brackets 30 aligned along the eave-ridge direction are spaced apart by a certain distance that matches the eave-ridge length of the solar cell modules 11. Each mounting bracket 30 is fixed to the roof 100 so that the guide rail portion 34 is disposed along the eave-ridge direction. The frames 13A. 13B are placed on the mounting bracket 30 to be substantially perpendicular to the guide rail portion 34.

Figure 2:
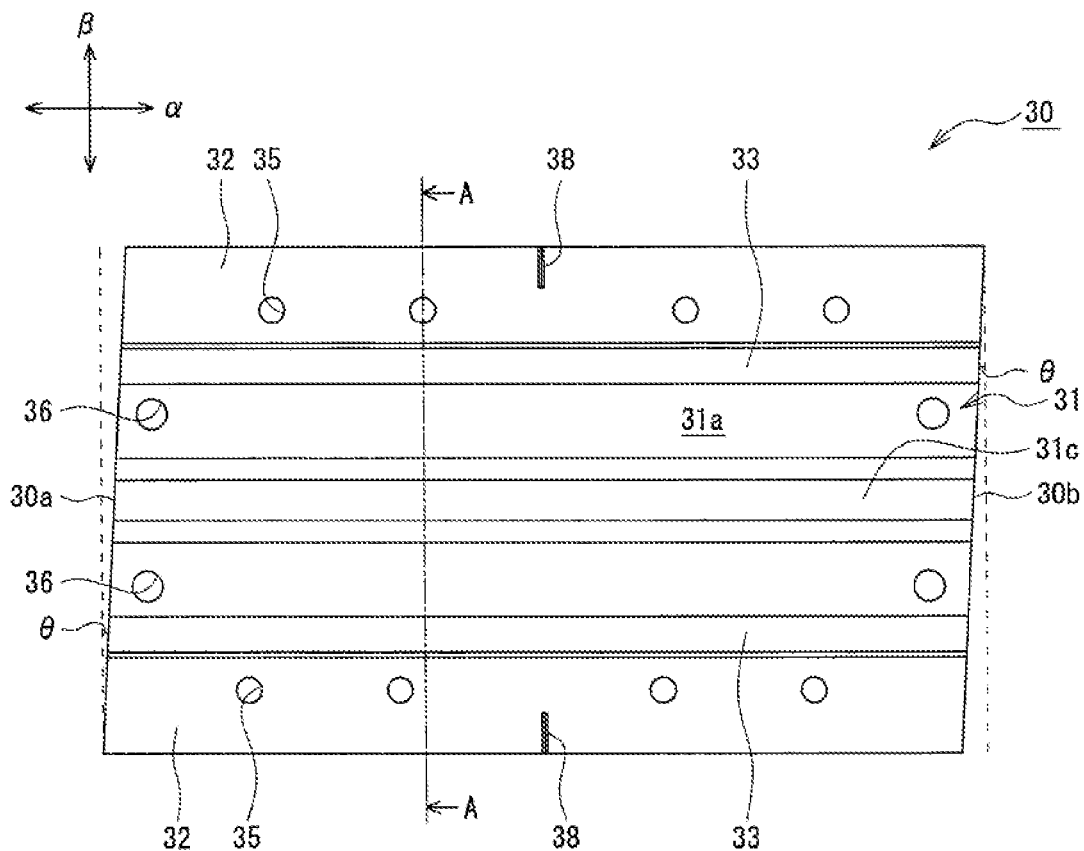
FIG. 2 is a plan view of a mounting bracket according to the one embodiment of the present disclosure.
Figure 3:
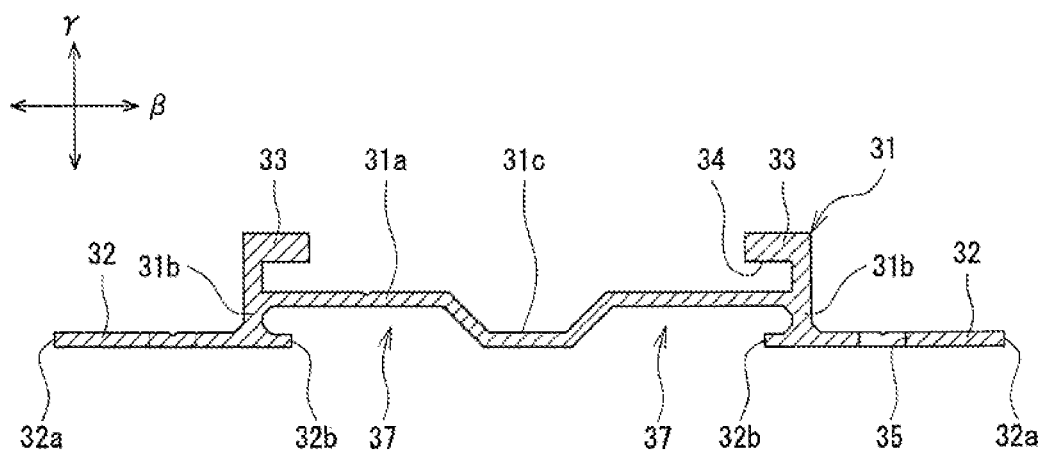
FIG. 3 is a cross-sectional view taken along line A-A in FIG. 2.

FIG. 2 is a plan view of the mounting bracket 30. FIG. 3 is a cross sectional view taken along line A-A in FIG. 2. As exemplarily shown in FIGS. 2 and 3, the mounting bracket 30 includes a base portion 31 on which the base bracket 40 is disposed and flange portions 32 that extend right and left from lower portions of the base portion 31. The mounting bracket 30 is a plate-shape fixing member that is disposed along the roof surface. The mounting bracket 30 includes fixing portions in which through holes are formed to pass the screws through to secure the mounting bracket 30 to the roof 100. Each through hole may be disposed 10 mm or more away from an edge of the fixing portion. In the present embodiment, the flange portions 32 are provided as the fixing portions.

The mounting bracket 30 has a shape that is longitudinally long along the eave-ridge direction. A ridge-side edge portion 30b of each mounting bracket 30 may be inclined with respect to the eave-ridge direction and the girder direction of the roof 100. Because the guide rail portion 34 may extend straight along the eave-ridge direction, the ridge-side edge portion 30b may be inclined by forming a cut surface of the ridge-side edge portion 30b to be inclined with respect to a longitudinal direction and a lateral direction. In this way, without sacrificing easy installation, drainage of rainwater or other liquid can be improved. In other words, because rainwater or other liquid is not blocked by the mounting brackets 30, the rainwater flows along the inclined ridge-side edge portion 30b.

An eave-side edge portion 30a of the mounting bracket 30 may be inclined with respect to the eave-ridge direction and the girder direction of the roof 100 at substantially the same angle as the ridge-side edge portion 30b. In other words, the eave-side edge portion 30a may be formed in substantially parallel with the ridge-side edge portion 30b. Although the tilting of the eave-side edge portion 30a does not affect the drainage, because the mounting brackets 30 are generally made by cutting a long material, it becomes possible to eliminate waste of materials by cutting ends at the same orientation at the same angle. The mounting bracket 30 may include marks, such as V-grooves, stamps, or others, to be used for making marks along the eave-ridge direction. Such a mark may be formed, for example, around the center on the upper surface of an upper portion 31a in the vicinity of the eave-side edge portion 30a.

The ridge-side edge portion 30b of the mounting bracket 30 may be inclined with respect to the girder of the roof 100 at an angle θ of about 3° to 15°. The angle θ within this range makes it easier to achieve both easy installation and sufficient drainage. The eave-side edge portion 30a may be inclined with respect to the girder also at an angle θ of about 3° to 15°. The mounting bracket 30 may have, for example, a substantially parallelogram shape with substantially equal opposing angles in a plan view.

The base portion 31 includes an upper portion 31a on which the base bracket 40 is placed, and side wall portions 31b extending downwards from both side edges of the upper portion 31a. Each of the side wall portions 31b connects the upper portion 31a and the flange portion 32. In the base portion 31, the side wall portions 31b are disposed substantially perpendicular to the upper portion 31a. Around a lateral center of the upper portion 31a, a concave portion 31c that is recessed downward entirely along the longitudinal direction is formed. By providing the concave portion 31c, it becomes possible to prevent the tip of the shaft portion of the bolt 16 that is fixed to the base bracket 40 from interfering with the upper portion 31a.

A pair of hook portions 33 are formed at an upper portion of the base portion 31. For the mounting bracket 30, each of the hook portions 33 is provided upright at each side edge of the upper portion 31a. Each of the hook portions 33 extends upright from each side edge of the upper portion 31a and is bent inwards to form a substantially L shape. The upper portion 31a and the hook portions 33 form the guide rail portion 34 that slidably supports the base bracket 40 so that the base bracket 40 is slidable along the longitudinal direction.

Except for the concave portion 31c, the upper portion 31a of the base portion 31 is disposed higher than the flange portions 32 that are in contact with the roof surface. In this way, space is provided between the upper portion 31a and the roof surface. The mounting bracket 30 may include drain grooves 37 provided for the entire length along the eave-ridge direction by providing space from the roof surface. The mounting bracket 30 includes drain grooves 37 that are provided on right and left sides of the concave portion 31c. The drain grooves 37 further improve the drainage of the roof 100 at locations where the photovoltaic power generation device 10 is installed.

The flange portions 32 outwardly extend from lower portions of the base portion 31. The flange portions 32 are formed for the entire length along the longitudinal direction of the mounting bracket 30. The flange portions 32 may also extend inwards of the base portion 31, in other words, under the upper portion 31a. The lateral length of the inward extension from the base portion 31 may be shorter than the lateral length of the hook portion 33. Each of the side wall portions 31b of the base portion 31 is formed, for example, substantially perpendicular to the flange portions 32. Each of the flange portions 32 includes multiple through holes 35 through which screws 107 (refer to FIG. 7 described below) pass. The multiple through holes 35 are aligned along the eave-ridge direction.

As described above, the through holes 35 may be formed 10 mm or more away from the edges of the flange portions 32. By providing the through holes 35 away from the edges of the flange portions 32, it becomes unlikely that rainwater or the like will reach the areas where the screws 107 are fastened. For example, the through holes 35 may be formed 10 mm or more away from longitudinally-oriented outer edges 32a of the flange portions 32 and from both longitudinally-outer ends of the flange portions 32 (the eave-side edge portion 30a and the ridge-side edge portion 30b). The through holes 35 may also be located 10 mm or more away from longitudinally-oriented internal edges 32b of the flange portions 32 that are in contact with the drain grooves 37. The through holes 35 may be, for example, substantially equally spaced apart from the outer edges 32a and the internal edges 32b.

The mounting bracket 30 may further include banding band holes 36 through which banding bands (not shown) that fasten wires pulled from the solar cell module 11 pass. In the embodiment shown in FIG. 2, four banding band holes 36 in total are formed, two at each longitudinally-outer edge portion of the upper portion 31a. For example, wires extending along the girder direction of the roof 100 are fixed at the eave-side edge portion or the ridge-side edge portion of the mounting bracket 30 using the banding bands that pass through the banding band holes 36.

The mounting bracket 30 may further include alignment marks 38 to be used at installation. In the embodiment shown in FIG. 2, linear alignment marks 38 laterally extending from the outer edges 32a are formed on the upper surface of each of the flange portions 32. The alignment marks 38 on right and left flange portions 32 are aligned linearly along the lateral direction. The mounting brackets 30 are disposed on the roof 100 to be aligned with, for example, the eave-side edges of the roofing materials 101.

Figure 4:
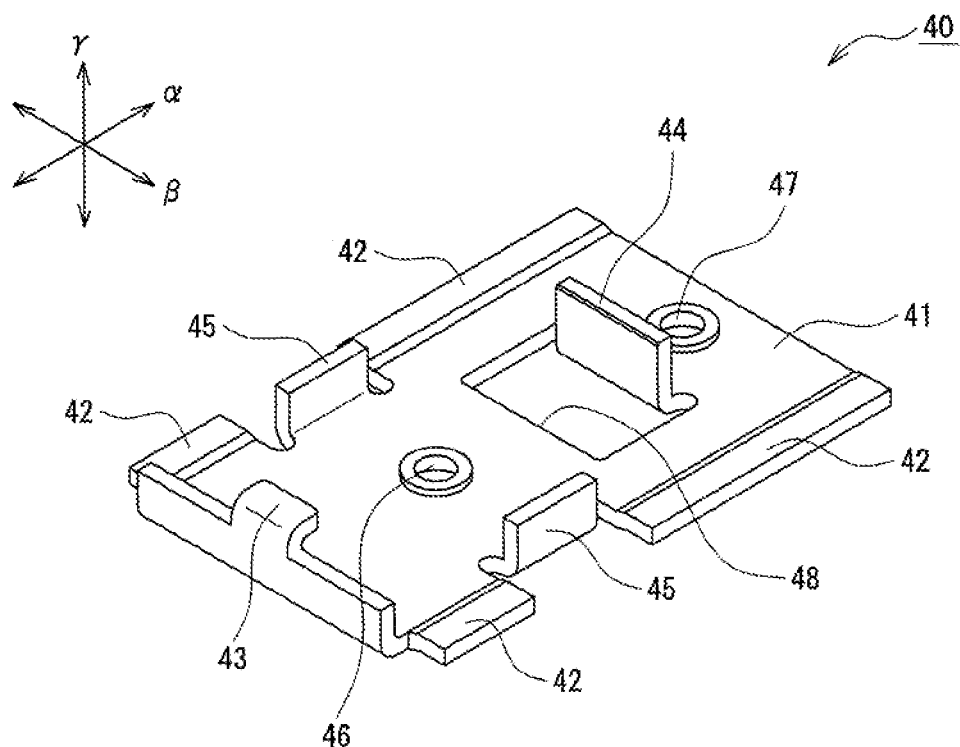
FIG. 4 is a perspective diagram of a base bracket according to the one embodiment of the present disclosure.
Figure 5:
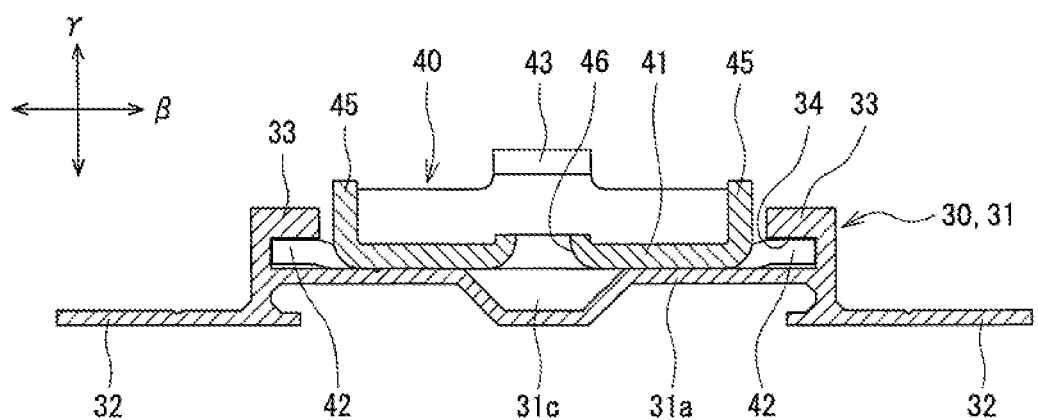
FIG. 5 is a cross-sectional view along a lateral direction, showing the base bracket attached to the mounting bracket.

FIG. 4 is a perspective diagram of the base bracket 40. FIG. 5 is a cross-sectional view along the lateral direction, showing the base bracket 40 attached to the mounting bracket 30. As exemplarily shown in FIGS. 4 and 5, the base bracket 40 may include a base portion 41 to which the bolt 16 that secures the fixing bracket 50 is to be fastened, and extending portions 42 that are to be inserted into the guide rail portion 34 of the mounting bracket 30. The base portion 41 has a width suitable to be disposed between the hook portions 33. The base portion 41 has a longer length along the eave-ridge direction.

The extending portions 42 extend from the right and left of the base portion 41. The extending portions 42 are inserted into the guide rail portion 34 so that the base bracket 40 engages with the mounting bracket 30 to prevent the base bracket 40 from being detached upward. Each of the extending portions 42 is bent slightly upwards at the base so that the upper surface of the extending portion 42 is located slightly higher than the upper surface of the base portion 41. The upper surface of the extending portion 42 is substantially planar. For example, when the bolt 16 is fastened to the base portion 41, the upper surfaces of the extending portions 42 abut against the lower surfaces of the hook portions 33 of the guide rail portion 34, securely attaching the base bracket 40 to the mounting bracket 30. In contrast, before the bolt 16 is fastened, the base bracket 40 is slidable along the guide rail portion 34.

The base bracket 40 may further include an engaging portion 43 and a ridge-side wall portion 44. As exemplarily shown in FIG. 7 described below, the frames 13A, 13B respectively include inner flange portions 25A, 25B that are located on a lower side of the solar cell modules 11A, 11B and extend inward of the solar cell modules 11A, 11B. The engaging portion 43 protrudes higher than the top of the mounting bracket 30 to engage with the inner flange portion 25A (first inner flange portion) of the frame 13A. The ridge-side wall portion 44 protrudes higher than the top of the mounting bracket 30 to oppose an edge of the inner flange portion 25B (second inner flange portion) of the frame 13B.

The engaging portion 43 is formed at an eave-side edge (a longitudinally-outer edge on one side) of the base portion 41 to have a substantially L-shape cross section so that the engaging portion 43 is spaced apart from the base portion 41 to enable insertion of the inner flange portion 25A therebetween. The ridge-side wall portion 44 has a height that does not interfere with installation of the frame 13B at a location opposing the edge of the inner flange portion 25B. The ridge-side wall portion 44 is formed, for example, by bending upward a portion of the metal plate of the base portion 41 between a ridge-side edge (the other longitudinally-outer edge on the other side) and the longitudinally center of the base portion 41. In order to enable such bending, an opening 48 is formed on the eave side of the ridge-side wall portion 44.

The base bracket 40 may include a bolt fastening spot 46 into which the bolt 16 is screwed and a temporal bolt fastening spot 47 into which a temporal bolt 17 (FIG. 7 described below) is screwed. The bolt fastening spot 46 is formed between the engaging portion 43 of the base portion 41 and the ridge-side wall portion 44 at a location vertically overlapping with the concave portion 31c of the mounting bracket 30. The temporal bolt fastening spot 47 is formed on the ridge-side of the ridge-side wall portion 44 of the base portion 41. Each of the bolt fastening spots may be formed by hole flanging and threading processes of the metal plate that forms the base portion 41. Although the flange formed by a hole flanging process protrudes upwards in the embodiment shown in FIGS. 4 and 5, the flange may be formed to protrude downwards. A downward hole flanging process is advantageous because bolts can be more easily inserted into the bolt fastening spots.

The base bracket 40 may include at least one other wall portion 45. In the present embodiment, the at least one wall portion 45 includes a plurality of wall portions 45, and the wall portions 45 are disposed on both lateral sides of the base portion 41 with the bolt fastening spot 46 therebetween. The wall portions 45 protrude higher than the top of the mounting bracket 30 and are inserted into the space between the frames 13A, 13B.

Figure 6:
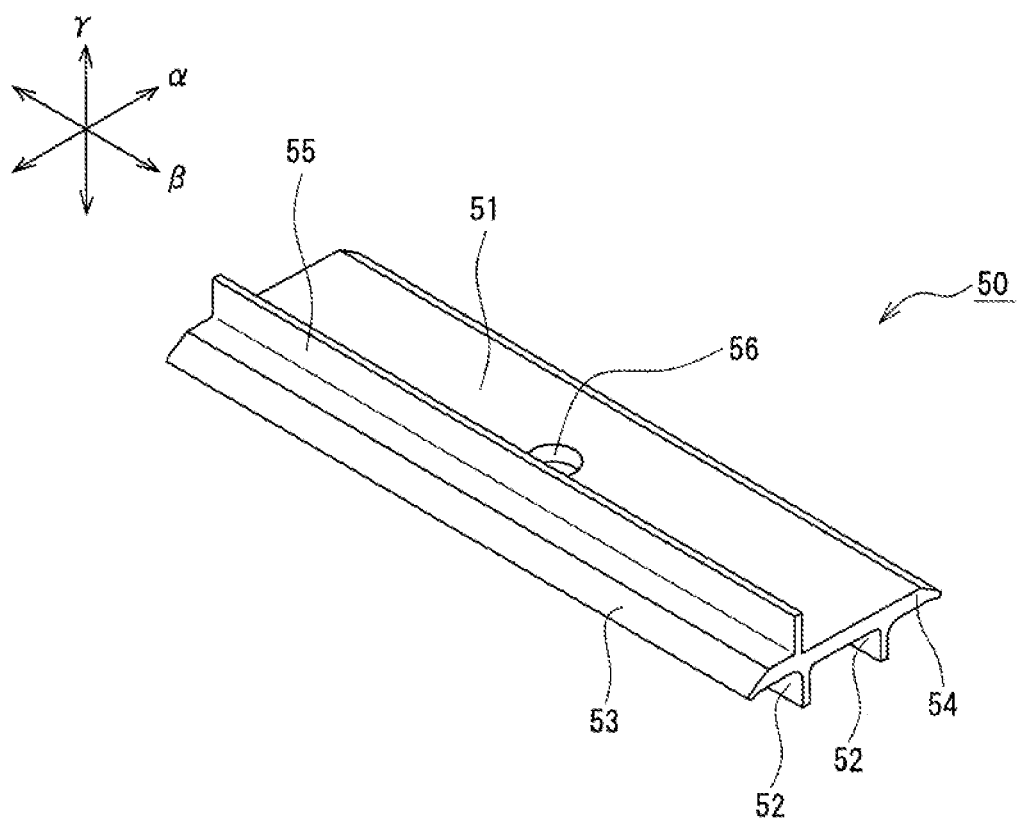
FIG. 6 is a perspective diagram of a fixing bracket according to the one embodiment of the present disclosure.

FIG. 6 is a perspective diagram of the fixing bracket 50. As shown in FIG. 6, each fixing bracket 50 includes a base 51 in which a through hole 56 through which the bolt 16 passes is formed and a pair of leg portions 52 that extend downwards from the base 51 and are inserted into the space S between the solar cell modules 11A, 11B. The fixing bracket 50 further includes a first pressing portion 53 that extends towards the eave side from the eave-side edge of the base 51 and is formed substantially perpendicular to the leg portion 52 on the eave side, and a second pressing portion 54 that extends towards the ridge-side from the ridge-side edge of the base 51 and is formed substantially perpendicular to the leg portion 52 on the ridge-side.

As described in detail further below, the first pressing portion 53 presses the frame 13A from above, whereas the second pressing portion 54 presses the frame 13B from above. Because of inclination of the roof surface, an edge of a bottom plate 23A of the frame 13A is slightly lifted from the mounting bracket 30 such that the height of a hook portion 21A from the top of the mounting bracket 30 is slightly higher than that of a hook portion 21B. Accordingly, the fixing bracket 50 may be inclined such that the height of a first pressing portion 53 from the top of the mounting bracket 30 is slightly higher than that of the second pressing portion 54.

Although the fixing bracket 50 may have a length substantially equal to the longitudinal length of the solar cell module 11 to be installed substantially entirely along the space S, the fixing brackets 50 in the present embodiment have lengths substantially equal to the width of the mounting bracket 30 in order to achieve easy installation. Each of the fixing bracket 50 is fastened to each mounting bracket 30 via the base bracket 40. The base 51, the leg portions 52, the first pressing portion 53, and the second pressing portion 54 are formed along the entire length of the fixing bracket 50. The through hole 56 is formed in the base 51, for example, at a longitudinal center.

The first pressing portion 53 is arranged to be shorter than the book portion 21A (refer to FIG. 7 described below) of the frame 13A that extends on a light receiving surface of the solar cell panel 12A such that the first pressing portion 53 presses the hook portion 21A from above. The second pressing portion 54 is also arranged to be shorter than the hook portion 21B (refer to FIG. 7 described below) of the frame 13B that extends on a light receiving surface of the solar cell panel 12B such that the second pressing portion 54 presses the hook portion 21B from above. Because upper surfaces of edge portions of the hook portions 21A, 21B are inclined downwards to the edges, edge portions of the pressing portions are bent slightly downwards to fit the hook portions.

Each fixing bracket 50 may include a wall portion 55 on the eave side of the through hole 56. The wall portion 55 is arranged, for example, to extend higher than the head of the bolt 16 that passes through the through hole 56 and be substantially perpendicular to the upper surface of the base 51. The wall portion 55 may be disposed on either one of the base 51 or the first pressing portion 53 as long as the wall portion 55 does not block the bolt 16 from being fastened. The wall portion 55 improves design of the photovoltaic power generation device 10 by hiding the head of the bolt 16.

Figure 7:
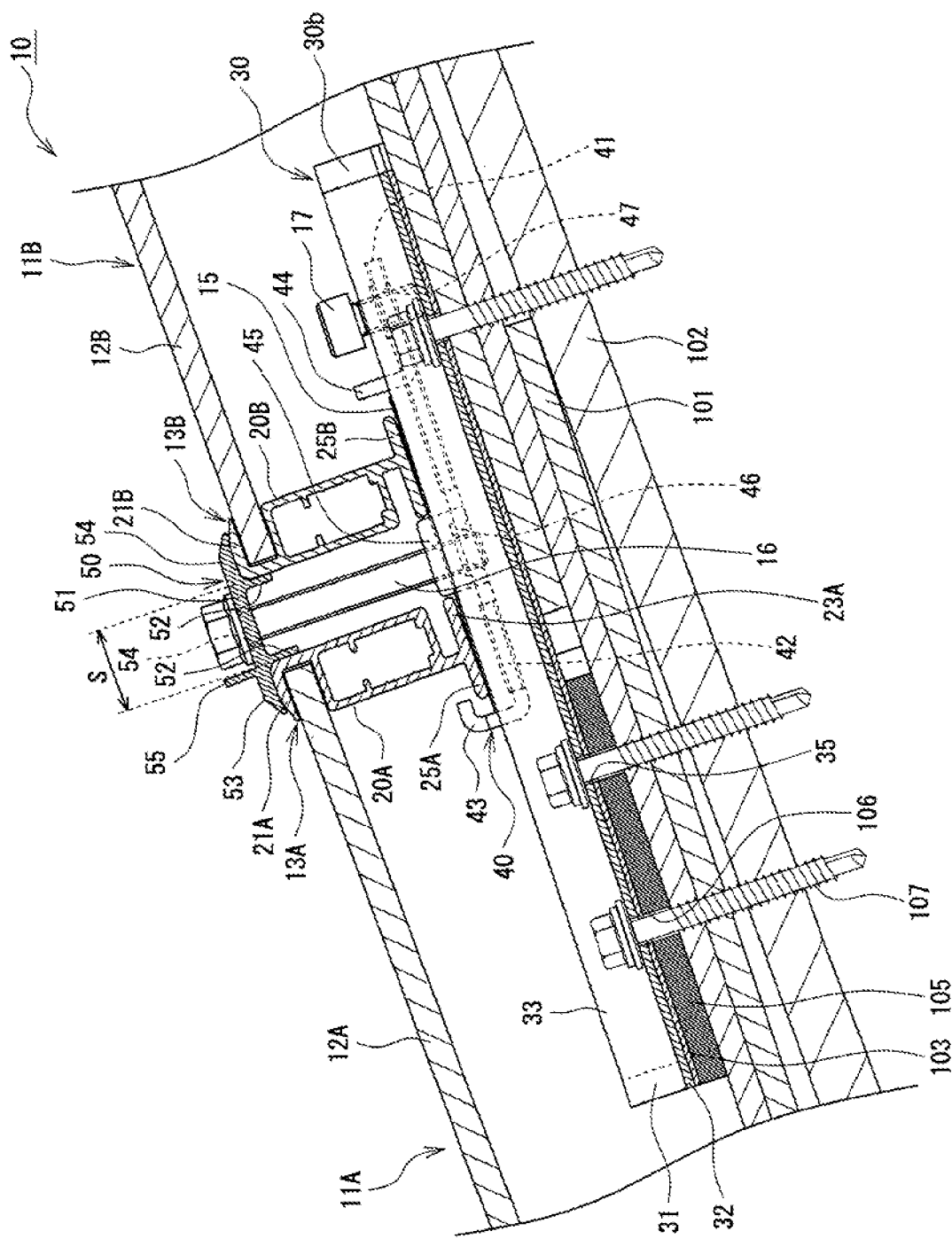
FIG. 7 is a cross-sectional view along a longitudinal direction, showing an installation arrangement of the photovoltaic power generation device according to the one embodiment of the present disclosure.

FIG. 7 is a cross sectional view along a longitudinal direction, showing an installation arrangement of the photovoltaic power generation device 10. The ridge-side edge portion of the solar cell module 11A and the eave-side edge portion of the solar cell module 11B are fixed to the roof 100 using the mounting bracket 30, the base bracket 40, and the fixing bracket 50.

As shown in FIG. 7, the frame 13A installed on the ridge-side edge portion of the solar cell module 11A and the frame 13B installed on the eave-side edge portion of the solar cell module 11B are disposed on the mounting bracket 30 via the grounding bracket 15. By fastening the bolt 16 passing through the through hole 56 of the fixing bracket 50 to the base bracket 40 engaged with the mounting bracket 30, the fixing bracket 50 presses the frames 13A, 13B from above.

The frames 13A, 13B respectively include body portions 20A, 20B, each having a substantially hollow rectangular column shape, and the hook portions 21A, 21B provided on top of the body portions 20A, 20B. Each of the hook portions 21A, 21B has a substantially L-shape cross section. The edges of the solar cell panels 12A, 12B are respectively inserted into inward grooves formed between the hook portions 21A. 21B and top surfaces of the body portions 20A, 20B.

The mounting brackets 30 are fixed to sheathing roof boards 102 of the roof 100 with the screws 107 attached to the flange portions 32 that are plate-shape fixing portions. In the embodiment shown in FIG. 7, the mounting bracket 30 is positioned so that the alignment marks 38 are aligned with the eave-side edge of the roofing material 101. The ridge-side of the mounting bracket 30 is fixed on the roof material 101, whereas the eave side is fixed on the spacer 105. Some screws 107 are inserted into the through holes 35 of the flange portions 32 and through holes 106 of the spacer 105 so that the screws 107 penetrate through the roofing materials 101 and are fixed to the sheathing roof board 102. For the screws 107, for example, wood screws with packing may be used. A rubber sheet 103 (for example, a butyl rubber sheet) is disposed between the mounting bracket 30 and the roofing material 101 and between the mounting bracket 30 and the spacer 105.

The solar cell modules 11A, 11B are fixed on the mounting brackets 30 so that the solar cell panels 12A, 12B are substantially parallel to the sheathing roof boards 102. Because the roof surface (upper surfaces of the roofing materials 101) is not parallel to the sheathing roof boards 102, the top surface of the mounting bracket 30 (top surfaces of the hook portions 33) on which the frames 13A. 13B are mounted is not parallel to the sheathing roof boards 102. In this way, the edge of the bottom plate 23A of the frame 13A is lifted slightly from the mounting bracket 30 such that the height of the hook portion 21A from the top of the mounting bracket 30 is slightly higher than the hook portion 21B.

The base bracket 40 is inserted into the guide rail portion 34 (refer to FIG. 3) of the mounting bracket 30. As described above, the guide rail portion 34 is formed along the entire longitudinal length of the mounting bracket 30 along the eave-ridge direction. In this way, until the frames 13A, 13B are mounted on the mounting bracket 30 and the bolt 16 is fastened, the base bracket 40 is slidable along the eave-ridge direction within an area not protruding from the mounting bracket 30. Although the frames 13A, 13B are mounted above the mounting bracket 30 on which the base bracket 40 is mounted, because the base bracket 40 is slidable as described above, positions of the frames 13A, 13B are highly flexible, achieving easy installation.

When positioning the frames 13A, 13B, the base bracket 40 can be temporarily fastened using the temporary bolt 17 to prevent movement along the eave-ridge direction. The temporary bolt 17 is screwed into the temporary bolt fastening spot 47 formed in the base portion 41 of the base bracket 40 so that the tip of a bolt shaft portion is pressed against the upper portion 31a of the mounting bracket 30 to temporarily fasten the base bracket 40 at a target position on the mounting bracket 30. The position of the base bracket 40 is easily adjustable by loosening the temporary bolt 17.

The frame 13A is disposed on the hook portion 33 of the mounting bracket 30 via the grounding bracket 15 on the eave side of a position corresponding to the bolt fastening spot 46 of the base bracket 40. The grounding bracket 15 includes upward protrusions and a through hole through which the bolt 16 passes. Grounding is provided by at least one of the protrusions of the grounding bracket 15 that pierces a coating film formed on a surface of the frame 13A to engage in a bottom surface of the frame 13A. At least one of the other protrusions of the grounding bracket 15 similarly engages in a bottom surface of the frame 13B.

The engaging portion 43 of the base bracket 40 is provided upright on the eave side of the frame 13A. The engaging portion 43 engages the frame 13A by overhanging the inner flange portion 25A of the frame 13A. In other words, the inner flange portion 25A is inserted between the base portion 41 and the engaging portion 43 of the base bracket 40. The inner flange portion 25A is pressed from above by the engaging portion 43, for example, when a pressure from below is applied to the solar cell module 11A.

The frame 13B is disposed on the hook portion 33 of the mounting bracket 30 via the grounding bracket 15 on the ridge-side of a position corresponding to the bolt fastening spot 46 of the base bracket 40. In other words, the space S through which the bolt 16 can pass is provided between the frame 13B and the frame 13A. The ridge-side wall portion 44 is provided on the ridge-side of the frame 13B at a position opposing the edge of the inner flange portion 25B to prevent the solar cell module 11B from moving to the ridge-side.

Each of the fixing bracket 50 is attached to straddle between the frames 13A, 13B and fixed to the base bracket 40 with the bolt 16. With the fixing bracket 50 fixed to the base bracket 40, the first pressing portion 53 of the fixing bracket 50 presses the hook portion 21A of the frame 13A from above, whereas the second pressing portion 54 presses the hook portion 21B of the frame 13B from above. Further, the solar cell modules 11A. 11B are prevented from moving along the eave-ridge direction by the leg portions 52 of the fixing bracket 50 that are inserted into the space S to abut against vertical side surfaces of the frames 13A, 13B.

Specifically, an upper corner portion of the frame 13A is pressed by the first pressing portion 53 and the eave-side leg portion 52, whereas an upper corner portion of the frame 13B is pressed by the second pressing portion 54 and the ridge-side leg portion 52. The wall portions 45 of the base bracket 40 are inserted into the space S between the frames 13A, 13B. The wall portions 45 may be substantially in contact with the frames 13A, 13B. Alternatively, a narrow space may be provided between the wall portions 45 and the frames 13A, 13B.

In the installation arrangement of the photovoltaic power generation device 10, by screwing the bolt 16 to the bolt fastening spot 46 of the base bracket 40, a pressing force from the fixing bracket 50 transmits to the frames 13A, 13B and the base bracket 40 is firmly fixed to the mounting bracket 30. When the bolt 16 is screwed into the bolt fastening spot 46, because the base bracket 40 is lifted upwards, the extending portions 42 inserted into the guide rail portion 34 strongly abut against the hook portions 33.

As described above, while the photovoltaic power generation device 10 can be easily installed, because each solar cell module 11 can be fixed to the roof 100 by pressing the solar cell module 11 with the fixing brackets 50, a high load bearing capacity can be obtained. In the photovoltaic power generation device 10, the fixing bracket 50 can be removed by loosening the bolt 16 disposed in the space S, for example, with the solar cell modules 11A, 11B already in place.

In other words, even when the target solar cell module 11 is not positioned at an edge of the photovoltaic power generation device 10, the target solar cell module 11 alone can be easily replaced without removing surrounding solar cell modules 11. Thus, the photovoltaic power generation device 10 has a high maintainability.

Next, a photovoltaic power generation device 10X according to another embodiment is described with reference to FIGS. 8 to 11. In the description below, the elements common to the above described photovoltaic power generation device 10 are referred with the same reference numerals and their redundant descriptions are omitted.

The photovoltaic power generation device 10X (refer to FIG. 11) differs from the photovoltaic power generation device 10 in that the photovoltaic power generation device 10X uses mounting brackets 60 (refer to FIG. 8) in place of the mounting brackets 30 and fixing brackets 70 (refer to FIG. 10) in place of the fixing brackets 50. Further, the photovoltaic power generation device 10X does not include the base bracket 40. The fixing bracket 70 is fixed to the mounting bracket 60 by attaching a socket nut 78 (refer to FIG. 11) to a bolt 76 that is disposed upright on the mounting bracket 60.

Figure 8:
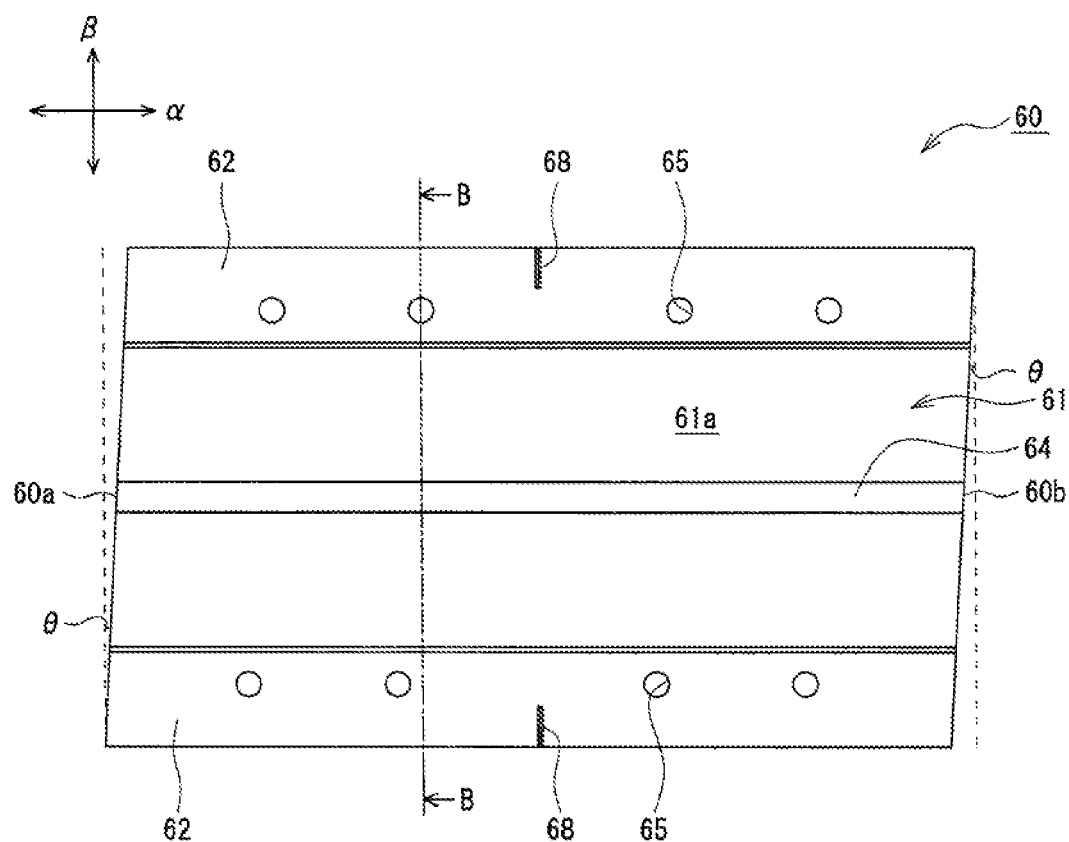
FIG. 8 is a plan view of a mounting bracket according to another embodiment of the present disclosure.
Figure 9:
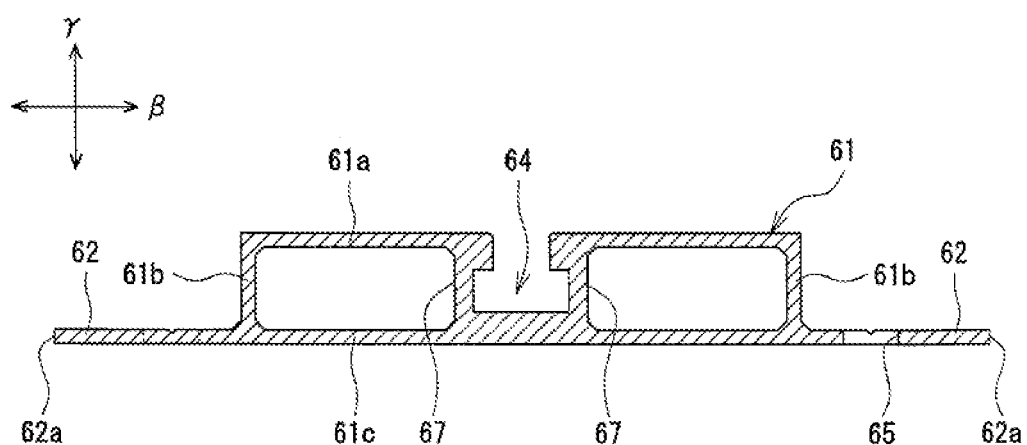
FIG. 9 is a cross-sectional view taken along line B-B in FIG. 8.

FIG. 8 is a plan view of the mounting bracket 60. FIG. 9 is a cross sectional view taken along line B-B in FIG. 8. As exemplarily shown in FIGS. 8 and 9, each mounting bracket 60 includes a base portion 61 on which the frames 13A, 13B of the solar cell modules 11A, 11B are disposed, and flange portions 62 that extend right and left from lower portions of the base portion 61. Each of the flange portions 62 is a plate-shape fixing member that is disposed along the roof surface. Each flange portion 62 includes multiple through holes 65 through which the screws 107 for fixing the mounting bracket 60 to the roof 100 pass.

Similarly to the mounting bracket 30, the mounting bracket 60 is longer along the eave-ridge direction. A ridge-side edge portion 60b is inclined with respect to the eave-ridge direction and the girder direction of the roof 100. The ridge-side edge portion 60b may be inclined at an angle θ of about 3° to 10° with respect to the girder direction of the roof 100. Because a bolt guide rail portion 64 described below may linearly extend along the eave-ridge direction, the ridge-side edge portion 60b may be inclined by forming a cut surface of the mounting bracket 60 to be inclined with respect to the longitudinal direction and the lateral direction. In this way, without sacrificing easy installation, drainage of rainwater or other liquid can be improved. Further, an eave-side edge portion 60a may be formed to be inclined with respect to the eave-ridge direction and the girder direction at substantially the same angle as the ridge-side edge portion 60b such that the eave-side edge portion 60a is substantially in parallel with the ridge-side edge portion 60b.

The mounting bracket 60 includes the bolt guide rail portion 64 that slidably (along the eave-ridge direction) supports the head of the bolt 76 so that the shaft portion of the bolt 76 for fixing the fixing bracket 70 is disposed upright and upwards. As described in detail further below, each of the fixing bracket 70 includes a through hole 72 through which the shaft portion of the bolt 76 disposed upright on the mounting bracket 60 passes so that the fixing bracket 70 is fixed to the mounting bracket 60 by screwing the socket nut 78 to the shaft portion of the bolt 76 that upwardly protrudes from the through hole 72.

The base portion 61 includes top portions 61a on which the frames 13A, 13B are placed, side wall portions 61b extending downwards from both laterally outer edges of the top portions 61a and connecting the top portions 61a and the flange portions 62, and a bottom portion 61c that connects the bottom edges of the side wall portions 61b. The side wall portions 61b are formed perpendicular to, for example, the top portions 61a, the bottom portion 61c, and the flange portions 62. The base portion 61 may have a hollow structure in consideration of weight savings and material cost reduction. Two hollow portions 67 may be formed that are enclosed by the walls and separated by the bolt guide rail portion 64.

The bolt guide rail portion 64 is provided for the entire longitudinal length of the base portion 61 at around the lateral center of the base portion 61. The bolt guide rail portion 64 is a groove that opens upwards in the hollow base portion 61. The top portions 61a partially further extend from the right and left over the groove to partially cover the opening. The head of the bolt 76 can be inserted into the bolt guide rail portion 64 so that the shaft portion of the bolt 76 protrudes from the opening. Because the head of the bolt 76 is caught by under surfaces of the top portions 61a that extend from the right and left, the bolt 76 is slidably (along the eave-ridge direction) supported by the bolt guide rail portion 64 such that the bolt 76 cannot be detached upwards.

The flange portions 62 extend outwardly from the bottom portions of the base portion 61 for the entire longitudinal length of the mounting bracket 60. Each of the flange portions 62 includes multiple through holes 65 through which the screws 107 pass. The multiple through holes 65 are aligned along the eave-ridge direction. The through holes 65 may be formed 10 mm or more away from the edges of the flange portions 62 to inhibit ingress of rainwater or other liquid to the areas where the screws 107 are fastened. For example, the through holes 65 are formed 10 mm or more away from longitudinally-oriented outer edges 62a of the flange portions 62 and from both longitudinally-outer ends of the flange portions 62 (the eave-side edge portion 60a and the ridge-side edge portion 60b).

Figure 10:
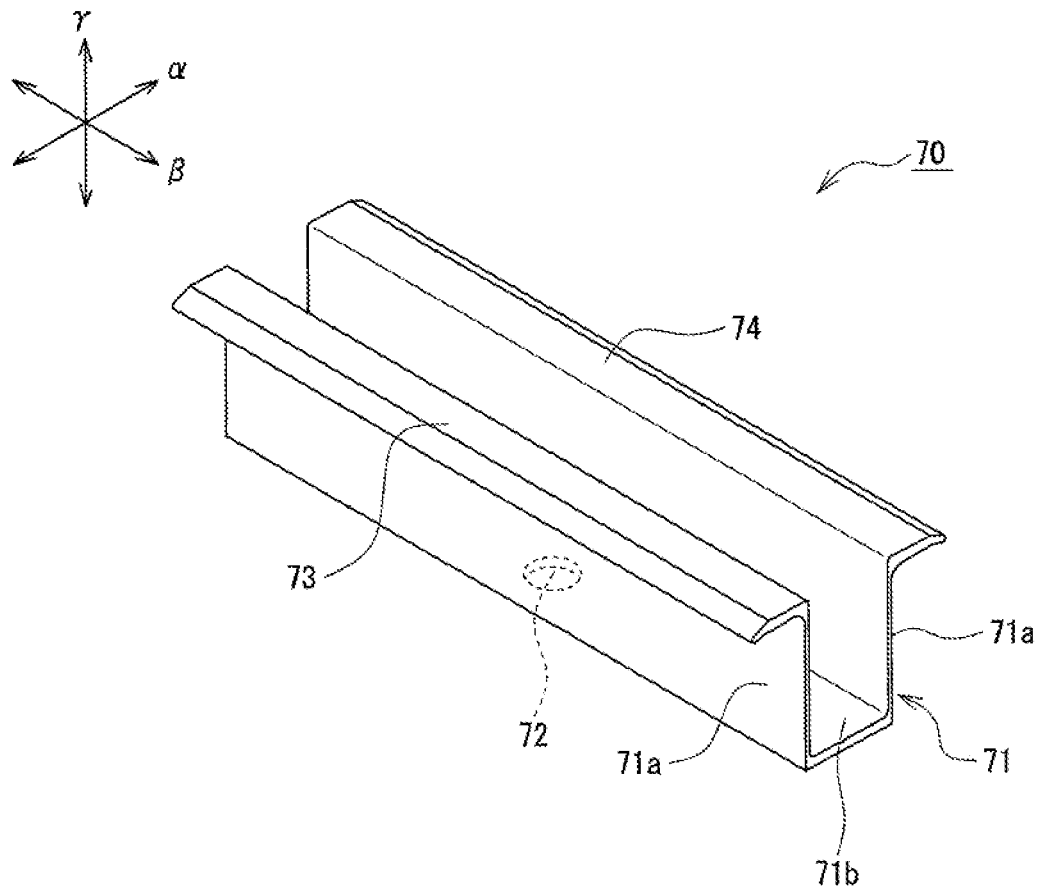
FIG. 10 is a perspective diagram of a fixing bracket according to the other embodiment of the present disclosure.

FIG. 10 is a perspective diagram of the fixing bracket 70. As shown in FIG. 10, each of the fixing brackets 70 includes a base portion 71 having a substantially U-shaped cross section when viewed from a lateral side. The base portion 71 includes a pair of side wall portions 71a that are formed substantially parallel to each other and a bottom portion 71b that connects lower edges of the side wall portions 71a. The through hole 72 is formed in the bottom portion 71b through which the bolt 76 that is disposed upright on the mounting bracket 60 passes.

The fixing bracket 70 further includes a first pressing portion 73 that extends to the eave side from an upper edge of the eave-side side wall portion 71a, and a second pressing portion 74 that extends to the ridge-side from an upper edge of the ridge-side side wall portion 71a. The first pressing portion 73 is arranged to be shorter than the hook portion 21A of the frame 13A, and presses the hook portion 21A from above. Similarly, the second pressing portion 74 is arranged to be shorter than the hook portion 21B of the frame 13B, and presses the hook portion 21B from above. The edge portions of the pressing portions are bent slightly downwards to fit the edge portions of the hook portions 21A, 21B.

Although the fixing bracket 70 may have the same length as the longitudinal length of the solar cell modules 11 and be installed for substantially the entire length of the space S, the fixing bracket 70 in the present embodiment has the same length as the width of the mounting bracket 60 in consideration of installation efficiency. Each of the fixing brackets 70 is fixed to each of the mounting brackets 60 using the bolt 76 and the socket nut 78 with the base portion 71 inserted into the space S. The base portion 71, the first pressing portion 73, and the second pressing portion 74 are formed for the entire length of the fixing bracket 70. The through hole 72 is formed, for example, at around the longitudinal center of the base portion 71.

The fixing bracket 70 may be arranged such that the height of the first pressing portion 73 from the top of the mounting bracket 60 is slightly higher than that of the second pressing portion 74. Although the bottom portion 71b of the base portion 71 may be formed perpendicular to the side wall portions 71a, the bottom portion 71b may be inclined such that the angle between the eave-side side wall portion 71a and the bottom portion 71b is slightly larger than the angle between the ridge-side side wall portion 71a and the bottom portion 71b.

Figure 11:
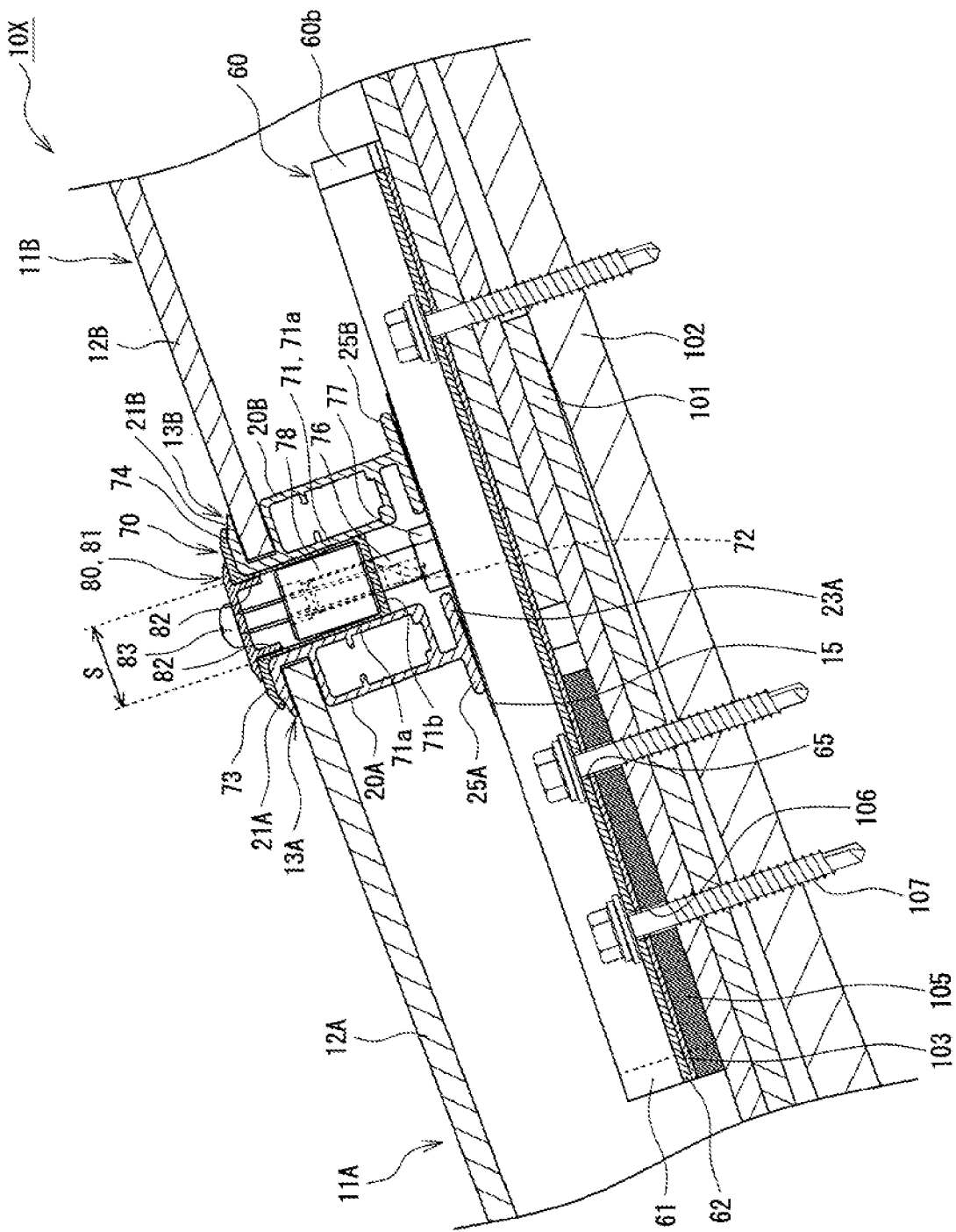
FIG. 11 is a cross-sectional view along a longitudinal direction, showing an installation arrangement of a photovoltaic power generation device according to the other embodiment of the present disclosure.

FIG. 11 is a cross sectional view along a longitudinal direction, showing an installation arrangement of the photovoltaic power generation device 10X. The ridge-side edge portion of the solar cell module 11A and the eave-side edge portion of the solar cell module 11B are fixed to the roof 100 using the mounting brackets 60 and the fixing brackets 70.

As shown in FIG. 11, the frame 13A installed on the ride-side edge portion of the solar cell module 11A and the frame 13B installed on the eave-side edge portion of the solar cell module 11B are disposed on the mounting bracket 60 via the grounding bracket 15. The fixing bracket 70 is inserted from above into the space S between the frames 13A, 13B. The bolt 76 disposed upright on the mounting bracket 60 is located at a lower portion in the space S. The fixing bracket 70 is fixed to the mounting bracket 60 and presses the frames 13A, 13B from above by fastening the socket nut 78 to the shaft portion of the bolt 76 that passes through the through hole 72 of the fixing bracket 70.

Similarly to the mounting bracket 30, each of the mounting brackets 60 is fixed to the sheathing roof board 102 of the roof 100 with the screws 107 fastened to the flange portions 62. The mounting bracket 60 is positioned so that an alignment mark 68 is aligned with the eave-side edge of the roofing material 101. The ridge-side of the mounting bracket 60 is fixed on the roofing material 101, whereas the eave side is fixed on the spacer 105. The frames 13A, 13B are arranged on the top portions 61a of the base portion 61 so that the frames 13A, 13B oppose each other with the bolt 76 therebetween. The frames 13A, 13B are spaced from each other to allow insertion of the base portion 71 of the fixing bracket 70. The rubber sheet 103 is disposed between the mounting bracket 60 and the roofing material 101 and between the mounting bracket 60 and the spacer 105.

Also, in the photovoltaic power generation device 10X, the solar cell modules 11A, 11B are fixed on the mounting bracket 60 so that the solar cell panels 12A, 12B are substantially parallel to the sheathing roof board 102. In this way, an edge of the bottom plate 23A of the frame 13A is lifted slightly from the mounting bracket 60 such that the height of the hook portion 21A from the top of the mounting bracket 60 is slightly higher than that of the hook portion 21B.

The bolt 76 is disposed upright on the base portion 61 of the mounting bracket 60 such that the head of the bolt 76 is inserted into the bolt guide rail portion 64 (refer to FIG. 9) and the shaft portion of the bolt 76 extends upward substantially perpendicular to the top portions 61a of the base portion 61. Because the bolt 76 is slidable along the eave-ridge direction within an area where the bolt 76 does not fall off from the bolt guide rail portion 64, positions of the frames 13A, 13B are highly flexible, achieving easy installation. The bolt 76 can be fixed by fastening, for example, a nut 77 to the shaft portion to avoid sliding.

Each of the fixing bracket 70 is attached to straddle between the frames 13A, 13B and the shaft portion of the bolt 76 passes through the through hole 72 formed in the bottom portion 71b of the base portion 71. The socket nut 78 is screwed to the bolt 76 at the shaft portion that protrudes upward from the bottom portion 71b. The socket nut 78 presses the bottom portion 71b from above to secure the fixing bracket 70 to the mounting bracket 60. The socket nut 78 is, for example, a nut including a socket into which a hex wrench is insertable. With the socket directed upwards, the socket nut 78 is fastened with a hex wrench.

The first pressing portion 73 of the fixing bracket 70 presses the hook portion 21A of the frame 13A from above, whereas the second pressing portion 74 presses the hook portion 21B of the frame 13B from above. The solar cell modules 11A, 11B are prevented from moving along the eave-ridge direction by the side wall portions 71a of the base portion 71 that abut against the vertical side surfaces of the frames 13A, 13B in the space S. An upper corner of the frame 13A is pressed by the first pressing portion 73 and the eave-side side wall portion 71a, whereas an upper corner of the frame 13B is pressed by the second pressing portion 74 and the ridge-side side wall portion 71a.

The photovoltaic power generation device 10X may further include a cover 80 that is attached on the fixing bracket 70. The cover 80 is disposed across the space S to straddle between the frames 13A, 13B. The cover 80 has, for example, a length substantially equal to the longitudinal length of the solar cell module 11 to entirely cover the space S. The cover 80 includes a base portion 81 that is disposed across the space S to straddle between the frames 13A, 13B, and two leg portions 82 that extend downward from the base portion 81 and are inserted into the space S. The leg portions 82 are formed, for example, parallel to each other and inserted inside the base portion 71 of the fixing bracket 70.

In the embodiment shown in FIG. 11, an eave-side portion of the base portion 81 is disposed on the first pressing portion 73 of the fixing bracket 70, whereas a ridge-side portion of the base portion 81 is disposed on the second pressing portion 74 of the fixing bracket 70. The eave-side leg portion 82 abuts against the eave-side side wall portion 71a of the base portion 71, whereas the ridge-side leg portion 82 abuts against the ridge-side side wall portion 71a. Because the height of the hook portion 21A from the top of the mounting bracket 60 is slightly higher than that of the hook portion 21B, as described above, the base portion 81 is, for example, inclined so that the eave-side portion of the base portion 81 is slightly higher than the ridge-side portion.

The cover 80 is fixed to the fixing bracket 70 with a screw 83 that passes through the lateral center of the base portion 81 to be fastened. The screw 83 is fixed to the bottom portion 71b of the fixing bracket 70 by passing through the base portion 81 from above at a location that does not interfere with the socket nut 78. As the screw 83, for example, a drill screw is used.

Similarly as the photovoltaic power generation device 10, the photovoltaic power generation device 10X achieves a high load bearing capacity while maintaining easy installation and maintenance. In the photovoltaic power generation device 10X with the cover 80, a target solar cell module 11 alone can be easily replaced by loosening the socket nut 78 and removing the fixing bracket 70 after removing the cover 80.

Figure 12:
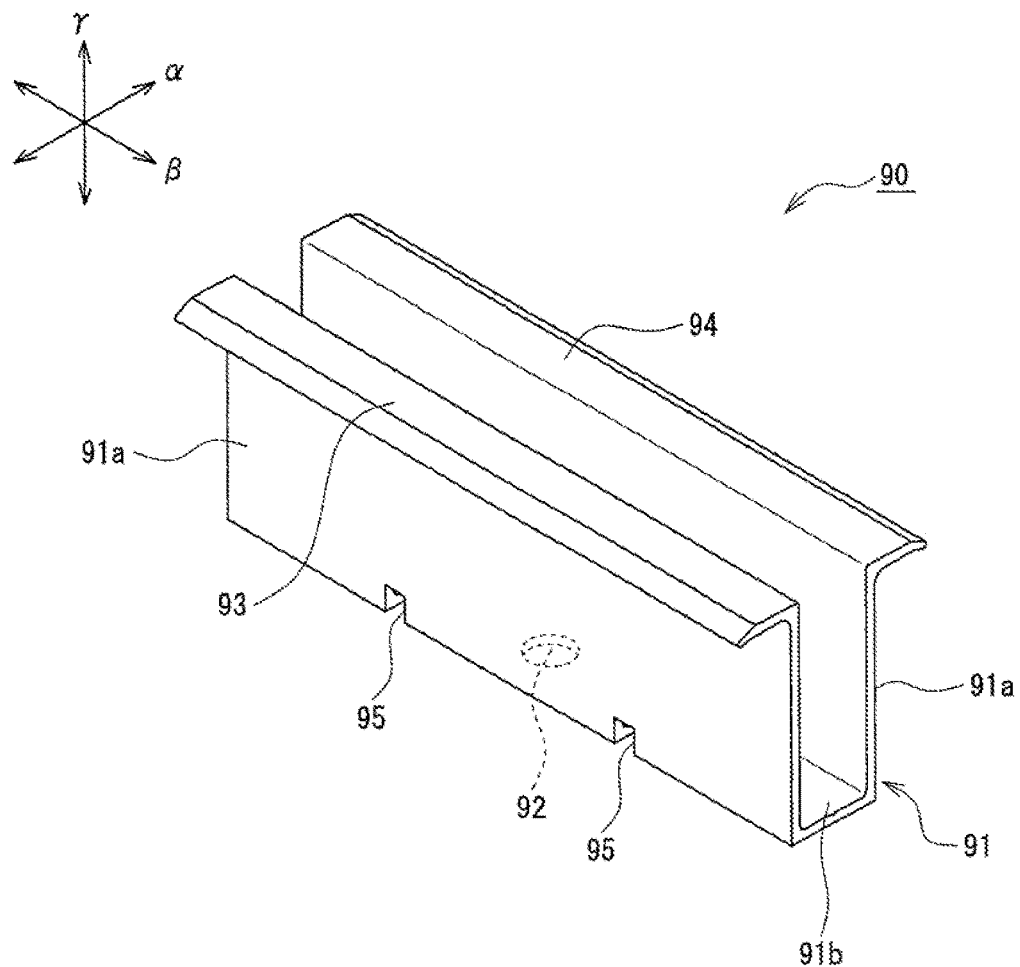
FIG. 12 is a perspective diagram of a fixing bracket according to yet another embodiment of the present disclosure.
Figure 13:
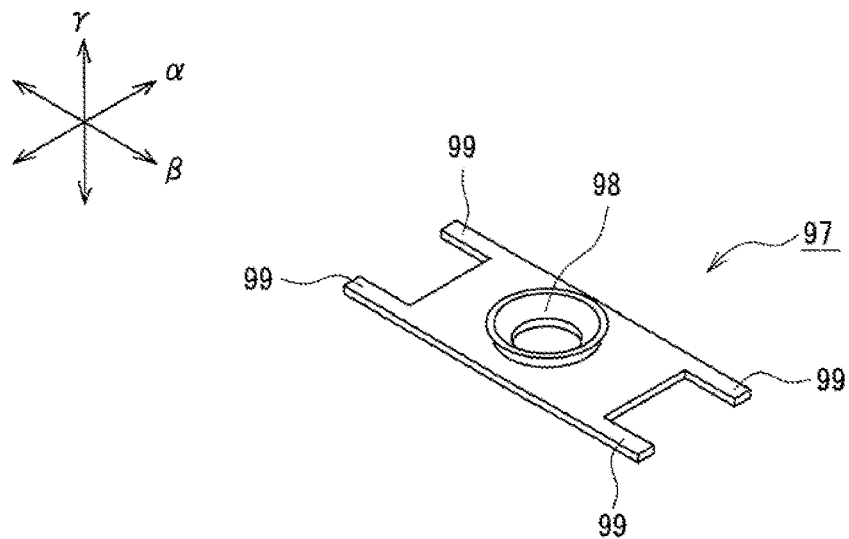
FIG. 13 is a perspective diagram of a guide member according to the yet other embodiment of the present disclosure.
Figure 14:
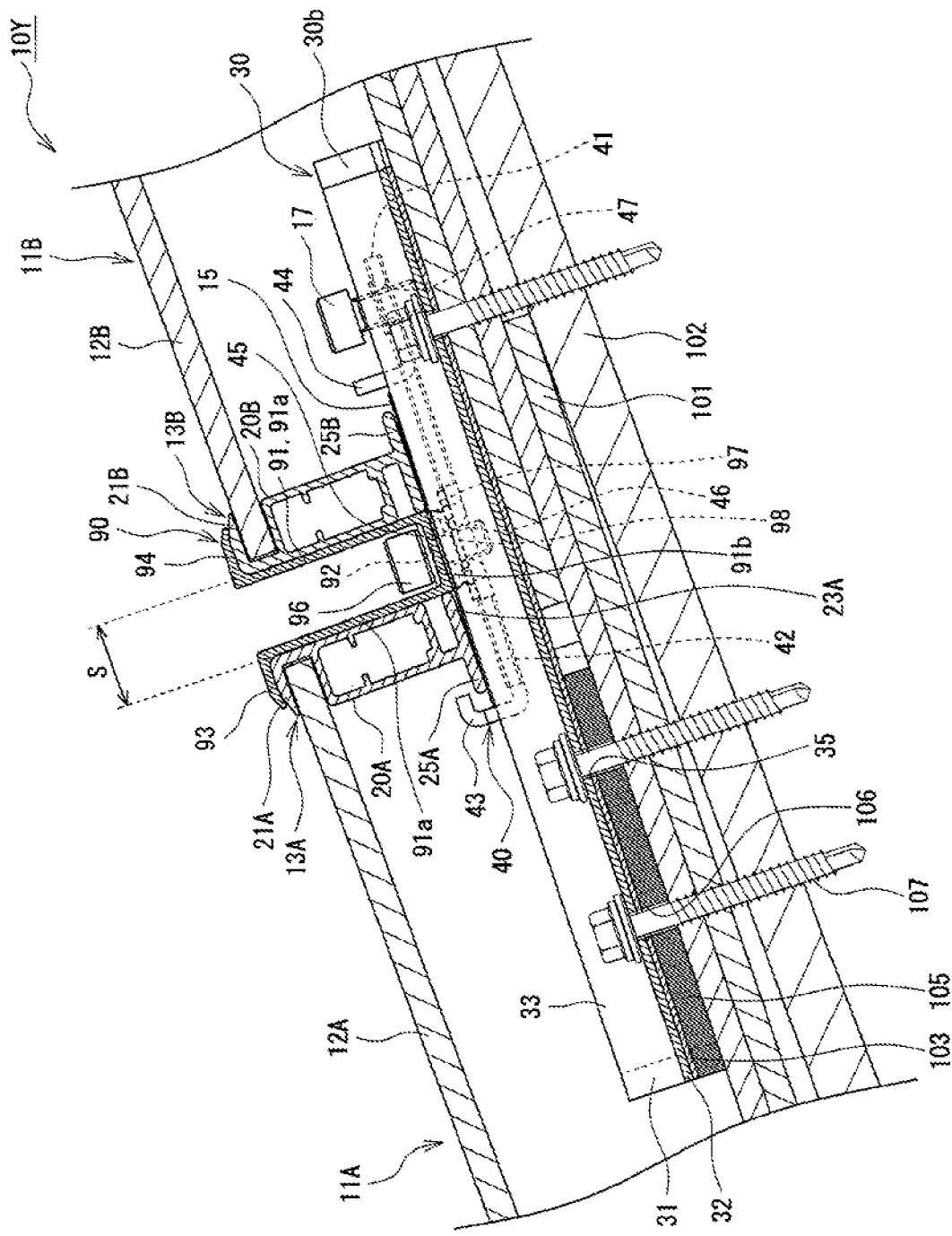
FIG. 14 is a cross-sectional view along a longitudinal direction, showing an installation arrangement of a photovoltaic power generation device according to the yet other embodiment of the present disclosure.

With reference to FIGS. 12 to 14, a photovoltaic power generation device 10Y of another embodiment is described below. In the description below, the elements common to the above described photovoltaic power generation devices 10, 10X are referred to with the same reference numerals and their redundant descriptions are omitted.

The photovoltaic power generation device 10Y (refer to FIG. 14) differs from the photovoltaic power generation device 10 in that the photovoltaic power generation device 10Y uses fixing brackets 90 (refer to FIG. 12) in place of the fixing brackets 50. However, the photovoltaic power generation device 10Y is similar to the photovoltaic power generation device 10 in that the photovoltaic power generation device 10Y includes the mounting brackets 30 and the base brackets 40. The photovoltaic power generation device 10Y further includes guide members 97 (refer to FIG. 13), each of which guides a bolt 96 for fixing the fixing bracket 50 to a fastening spot of the base bracket 40. The guide member 97 is disposed on the base bracket 40 and inserted to the guide rail portion 34 of the mounting bracket 30.

FIG. 12 is a perspective diagram of the fixing bracket 90. As exemplarily shown in FIG. 12, each of the fixing brackets 90 includes a base portion 91 that has a U-shaped cross section when viewed from a lateral side, similarly to the fixing bracket 70. The base portion 91 includes two side wall portions 91a, and a bottom portion 91b in which a through hole 92 through which the bolt 96 for fixing the fixing bracket 50 passes. The fixing bracket 90 further includes a first pressing portion 93 that extends towards the eave side from an upper edge of the eave-side side wall portion 91a, and a second pressing portion 94 that extends towards the ridge-side from an upper edge of the ridge-side side wall portion 91a.

The fixing bracket 90 is fixed to the mounting bracket 30 via the base bracket 40. As described above, the base bracket 40 includes the wall portions 45 that protrude higher than the top of the mounting bracket 30 and are disposed in the space S between the solar cell module 11A and the solar cell module 11B. The wall portions 45 are disposed upright on both lateral sides of the base portion 41 with the bolt fastening spot 46 of the base bracket 40 therebetween. The bolt 96 is screwed into the bolt fastening spot 46.

Each of the fixing brackets 90 includes at least one slit 95 to which the at least one wall portion 45 can be inserted. In the present embodiment, the at least one slit 95 includes a plurality of slit 95, and two slits 95 that are spaced apart at a distance corresponding to the distance between the wall portions 45 are disposed on the bottom portion 91b, with the through hole 92 through which the bolt 96 passes therebetween. Each of the slits 95 is formed by, for example, cutting out the bottom portion 91b and a lower portion of the side wall portions 91a of the base portion 91 along the width.

FIG. 13 is a perspective view of the guide member 97. The guide member 97 is a laterally-long board shaped member used to guide the bolt 96 to the bolt fastening spot 46 of the base bracket 40. A guide hole 98 is formed at the center of the guide member 97. The guide hole 98 is a through hole through which the bolt 96 passes. A rising portion that is tapered downwards is formed around the guide hole 98. The guide member 97 may include extending portions 99 that are inserted in the guide rail portion 34 of the mounting bracket 30. A total of four extending portions 99 are provided, two each on right and left sides of the guide member 97.

FIG. 14 is a cross sectional view along a longitudinal direction, showing an installation arrangement of the photovoltaic power generation device 10, in which the ridge-side edge portion of the solar cell module 11A and the eave-side edge portion of the solar cell module 11B are fixed to the roof 100 using the mounting brackets 30, base brackets 40, and the fixing brackets 90.

As exemplarily shown in FIG. 14, the base portion 91 of the fixing bracket 90 and the wall portions 45 of the base bracket 40 are inserted respectively from above and below into the space S between the frames 13A, 13B that are mounted on the mounting bracket 30 via the grounding bracket 15. Each of the fixing brackets 90 is attached with the bolt 96 to straddle between the frames 13A, 13B.

The bolt 96 is passed through the through hole 92 of the base portion 91 that is inserted into the space S and screwed into the bolt fastening spot 46 of the base bracket 40. In this way, the fixing bracket 70 is fixed to the mounting bracket 30 and presses the frames 13A, 13B from above. Specifically, the first pressing portion 93 of the fixing bracket 90 presses the hook portion 21A of the frame 13A from above, whereas the second pressing portion 94 presses the hook portion 21B of the frame 13B from above.

The guide member 97 may be provided between the fixing bracket 90 and the base bracket 40. The guide member 97 serves to guide the bolt 96 that passes through the through hole 92 of the base portion 91 to the bolt fastening spot 46 of the base bracket 40 such that the guide hole 98 is disposed on the base bracket 40 at a location overlapping with the bolt fastening spot 46.

In the fixing bracket 90, the side wall portions 91a of the base portion 91 respectively abut against the vertical side surfaces of the frames 13A. 13B. The bottom portion 91b is located lower than the top of the wall portions 45. The wall portions 45 are inserted into the slits 95 (refer to FIG. 12) formed in the bottom portion 91b so that the wall portions 45 protrude higher than an upper surface of the bottom portion 91b. With the wall portions 45 inserted into the slits 95 and hooked at edge portions of the slits 95, the joint force between, for example, the fixing bracket 90 and the base bracket 40 increases.

Figure 15:
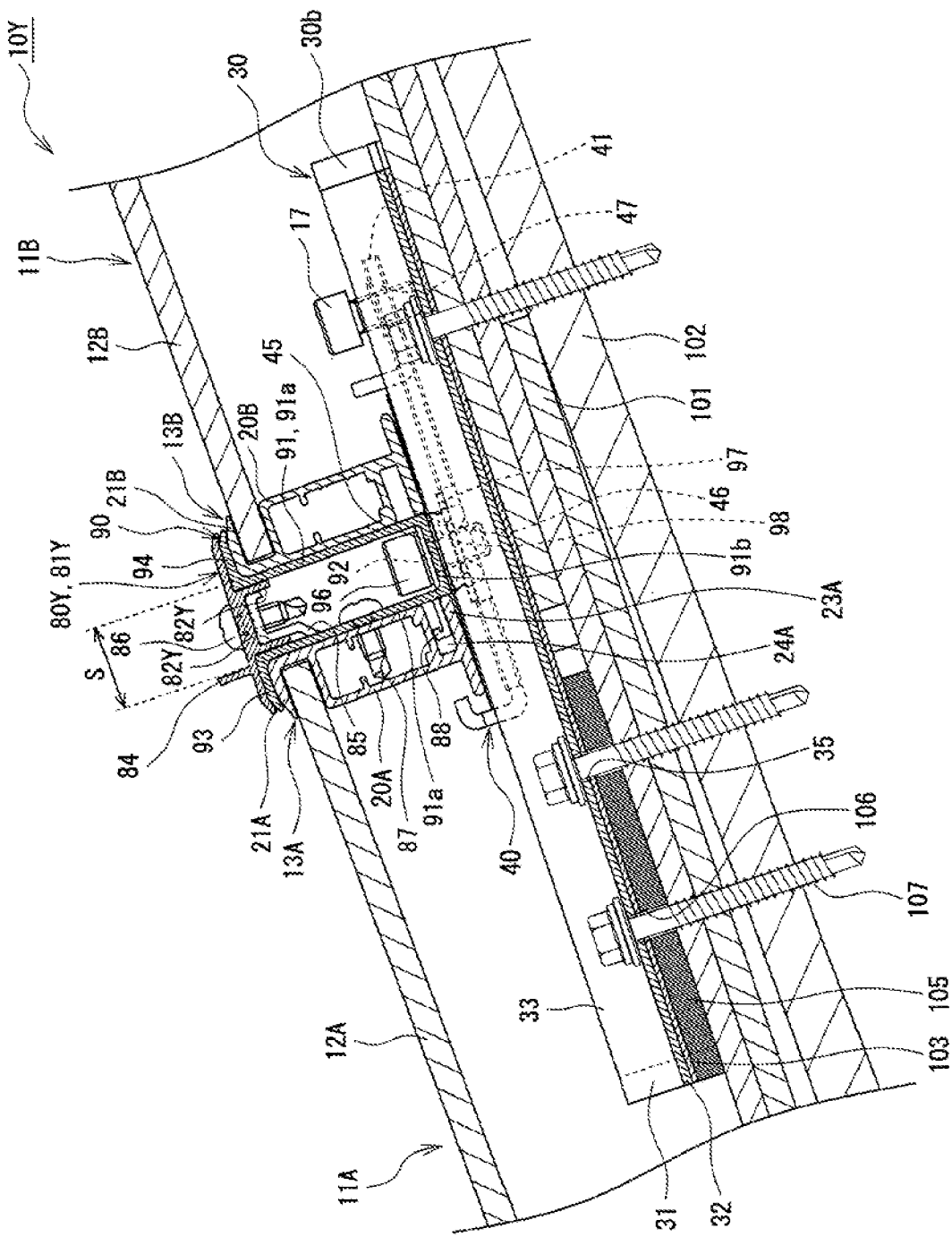
FIG. 15 is a cross-sectional view along a longitudinal direction, showing an installation arrangement of a photovoltaic power generation device according to still another embodiment of the present disclosure.

As exemplarily shown in FIG. 15, the photovoltaic power generation device 10Y may include a cover 80Y that is disposed across the space S to straddle between the frames 13A, 13B, and attached on the fixing bracket 90. The cover 80Y differs from the cover 80 of the photovoltaic power generation device 10X in that a base portion 81Y extends to a position corresponding to the edge of the pressing portions of the fixing bracket 90, and that the cover 80Y includes a snow guard 84 that is disposed upright on an upper surface of the base portion 81Y. The cover 80Y is fixed to the frame 13A with a support bracket 85.

On the eave side of the base portion 81Y, the snow guard 84 is arranged to be higher than the head of a screw 86 that secures the cover 80Y to the support bracket 85. The snow guard 84 has a height of for example, about 7 mm. The snow guard 84 may be formed for the entire length of the cover 80Y. In that case, water drainage holes may be formed at predetermined intervals.

The support bracket 85 is disposed at the space S between the frames 13A, 13B. A top portion of the support bracket 85 abuts against a lower surface of the base portion 81Y. The cover 80Y is fixed to a top portion of the support bracket 85 with the screw 86 that passes through the base portion 81Y. The support bracket 85 may include a claw portion 88 that is inserted into an outward groove 24A of the frame 13A. The claw portion 88 is formed by for example, bending a lower portion of the support bracket 85 to the opposite direction (eave side) to the top portion. The support bracket 85 extends downward along the body portion 20A of the frame 13A. The support bracket 85 is fixed to the body portion 20A with a screw 87 and with the claw portion 88 that is inserted into the outward groove 24A.

In summary, the frame 13A includes the outward groove 24A that outwardly opens from the solar cell module 11A. The photovoltaic power generation device 10Y further includes the support bracket 85 that is inserted into the outward groove 24A to be fixed to the frame 13A and the cover 80Y is screwed to the support bracket 85. The outward groove 24A is formed between the bottom plate and the body portion 20A of the frame 13A. Although the outward grooves are also shown in the photovoltaic power generation devices 10, 10X in the drawings, these outward grooves may be omitted.

Similarly to the photovoltaic power generation devices 10, 10X, the photovoltaic power generation device 10Y achieves easy installation and maintenance, while providing a high load-bearing capacity. In the photovoltaic power generation device 10Y, a target solar cell module 11 alone may be easily replaced by loosening the bolt 96 and removing the fixing bracket 90 after removing the cover 80Y if attached.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

The invention claimed is:

1. A photovoltaic power generation device comprising:
a first solar cell module including a first solar cell panel and a first frame installed at an edge portion of the panel;
a second solar cell module including a second solar cell panel and a second frame installed at an edge portion of the panel, the second solar cell module being disposed next to and on a ridge-side of the first solar cell module with a space therebetween;
a mounting bracket to be fixed to a roof, the mounting bracket allowing a part of the first frame that is installed at a ridge-side edge portion of the first solar cell module, and a part of the second frame that is installed at an eave-side edge portion of the second solar cell module, to be mounted thereon; and
a fixing bracket disposed at the space to straddle between the first frame and the second frame, the fixing bracket being fixed to the mounting bracket to press the frames from above,
wherein the photovoltaic power generation device further comprises a base bracket to which a bolt for fixing the fixing bracket is fastened,
the mounting bracket includes a guide rail portion that slidably supports the base bracket such that the base bracket is slidable along a eave-ridge direction of the roof,
the fixing bracket is fixed to the mounting bracket via the base bracket inserted into the guide rail portion, and
wherein the first frame includes a first inner flange portion extending to an inner side of the first solar cell module, and
the base bracket includes an engaging portion that protrudes higher than the top of the mounting bracket and engages with the first inner flange portion.

2. The photovoltaic power generation device according to claim 1,
wherein the second frame includes a second inner flange portion extending to an inner side of the second solar cell module, and
the base bracket includes a ridge-side wall portion that protrudes higher than the top of the mounting bracket and is disposed to oppose an edge of the second inner flange portion.

3. The photovoltaic power generation device according to claim 1, wherein
the photovoltaic power generation device further comprises a cover that is provided across the space to straddle between the first frame and the second frame, and is attached on the fixing bracket.

4. The photovoltaic power generation device according to claim 1, wherein
the photovoltaic power generation device further comprises a cover that is provided across the space to straddle between the first frame and the second frame, and is attached on the fixing bracket
the first frame includes a first outward groove that outwardly opens from the first solar cell module, and
the photovoltaic power generation device further comprises a support bracket that is fixed to the first frame by being inserted into the first outward groove, and the cover is screwed to the support bracket.

5. The photovoltaic power generation device according to claim 1, wherein
the base bracket includes at least one wall portion that protrudes higher than the top of the mounting bracket and are disposed in the space between the first solar cell module and the second solar cell module, and
the fixing bracket includes at least one slit into which the at least one wall portion is inserted.

6. The photovoltaic power generation device according to claim 1, wherein
the photovoltaic power generation device further comprises a guide member that guides the bolt to a fastening spot of the base bracket, and the guide member is disposed on the base bracket and inserted into the guide rail portion of the mounting bracket.

7. A photovoltaic power generation device comprising:
a first solar cell module including a first solar cell panel and a first frame installed at an edge portion of the panel;
a second solar cell module including a second solar cell panel and a second frame installed at an edge portion of the panel, the second solar cell module being disposed next to and on a ridge-side of the first solar cell module with a space therebetween;
a mounting bracket to be fixed to a roof, the mounting bracket allowing a part of the first frame that installed at a ridge-side edge portion of the first solar cell module, and a part of the second frame that is installed at an eave-side edge portion of the second solar cell module, to be mounted thereon; and
a fixing bracket disposed at the space to straddle between the first frame and the second frame, the fixing bracket being fixed to the mounting bracket to press the frames from above, wherein
the photovoltaic power generation device further comprises a base bracket to which a bolt for fixing the fixing bracket is fastened,
the mounting bracket includes a guide rail portion that slidably supports the base bracket such that the base bracket is slidable along an eave-ridge direction of the roof, and
the fixing bracket is fixed to the mounting bracket via the base bracket inserted into the guide rail portion,
wherein the second frame includes a second inner flange portion extending to an inner side of the second solar cell module, and
the base bracket includes a ridge-side wall portion that protrudes higher than the top of the mounting bracket and is disposed to oppose an edge of the second inner flange portion.

8. The photovoltaic power generation device according to claim 7, wherein
the first frame includes a first inner flange portion extending to an inner side of the first solar cell module, and
the base bracket includes an engaging portion that protrudes higher than the top of the mounting bracket and engages with the first inner flange portion.

9. The photovoltaic power generation device according to claim 7, wherein
the fixing bracket includes at least one slit into which the at least one wall portion is inserted.

10. The photovoltaic power generation device according to claim 7, wherein
the photovoltaic power generation device further comprises a guide member that guides the bolt to a fastening spot of the base bracket, and
the guide member is disposed on the base bracket and inserted into the guide rail portion of the mounting bracket.

11. The photovoltaic power generation device according to claim 7, wherein
the photovoltaic power generation device further comprises a cover that is provided across the space to straddle between the first frame and the second frame, and is attached on the fixing bracket.

12. The photovoltaic power generation device according to claim 7, wherein
the photovoltaic power generation device further comprises a cover that is provided across the space to straddle between the first frame and the second frame, and is attached on the fixing bracket
the first frame includes a first outward groove that outwardly opens from the first solar cell module, and
the photovoltaic power generation device further comprises a support bracket that is fixed to the first frame by being inserted into the first outward groove, and the cover is screwed to the support bracket.

* * * * *